United States Patent [19]

Morizuka

[11] Patent Number: 5,331,186
[45] Date of Patent: Jul. 19, 1994

[54] HETEROJUNCTION BIPOLAR TRANSISTOR WITH BASE ELECTRODE HAVING SCHOTTKY BARRIER CONTACT TO THE EMITTER

[75] Inventor: Kouhei Morizuka, Yokohama, Japan

[73] Assignee: Kabushiki Kaisha Toshiba, Kawasaki, Japan

[21] Appl. No.: 846,059

[22] Filed: Mar. 5, 1992

[30] Foreign Application Priority Data

Mar. 6, 1991 [JP] Japan .................................. 3-040284

[51] Int. Cl.$^5$ .................. H01L 29/161; H01L 29/205; H01L 29/225
[52] U.S. Cl. .................................... 257/198; 257/477; 257/473
[58] Field of Search ................ 257/198, 473, 477, 478, 257/479, 471, 472

[56] References Cited

U.S. PATENT DOCUMENTS

| | | | |
|---|---|---|---|
| 4,394,673 | 7/1983 | Thompson et al. | 257/478 |
| 4,586,071 | 4/1986 | Tiwari | 257/479 |
| 4,794,440 | 12/1988 | Capasso et al. | 257/191 |
| 5,001,534 | 3/1991 | Lunardi et al. | 257/197 |
| 5,150,185 | 9/1992 | Yamada | 257/198 |
| 5,177,583 | 1/1993 | Endo et al. | 257/198 |

FOREIGN PATENT DOCUMENTS

| | | |
|---|---|---|
| 0164517 | 12/1985 | European Pat. Off. . |
| 0306258 | 3/1989 | European Pat. Off. . |
| 0390522 | 10/1990 | European Pat. Off. . |
| 0408252A3 | 1/1991 | European Pat. Off. . |
| 61-79253 | 4/1986 | Japan . |

OTHER PUBLICATIONS

Tu et al., "Low Schottky Barrier of Rare-Earth Silicide on n-Si," Applied Physics Letters, vol. 38, No. 8, (Apr. 15, 1981), pp. 626–628.

IEEE Elecron Device Lertters, vol. 10, No. 2, Feb., 1989, pp. 52–54, Si/Si$_{1-x}$Ge$_x$ Heterojunction Bipolar Transistors Produced by Limited Reaction Processing, C. A. King et al.

Primary Examiner—Sara W. Crane
Assistant Examiner—John Guay
Attorney, Agent, or Firm—Finnegan, Henderson, Farabow, Garrett & Dunner

[57] ABSTRACT

A high-cut-off frequency, high-speed HBT is obtained by suppressing the diffusion of impurities to the utmost by lowering a heat treatment temperature in the step subsequent to the formation of a high concentration base layer. A base electrode for a base layer is made of a metal or an intermetallic compound which extends the emitter layer to reach at least a part of the base layer. The metal or intermetallic compound forms Schottky barrier with an emitter layer having a wide forbidden width, and ohmic contacts with the base layer with a narrow forbidden band. The barrier potential of the Schottky junction formed between the intermetallic compound or metal and the emitter layer is higher than the diffusion potential of a pn junction between the base layer and the emitter layer.

9 Claims, 6 Drawing Sheets

HETEROJUNCTION BIPOLAR TRANSISTOR WITH BASE ELECTRODE HAVING SCHOTTKY BARRIER CONTACT TO THE EMITTER

BACKGROUND OF THE INVENTION

1. Field of the Invention

The present invention relates to a semiconductor device and a method of making the same, and more particularly to improvements to the base electrode of an Heterojunction Bipolar Transistor (HBT).

2. Description of the Related Art

Bipolar transistors play an important role as a high-speed integrated circuit device because of their capability of outputting a large load drive force. In order to operate a bipolar transistor at high speed with low power consumption, it is effective to increase the cut-off frequency and to reduce the quantity of electric charges stored in the transistor. To this end, the base layer must be thin so as to reduce the electron transmit time.

In conventional silicon transistors, the emitter impurity concentration is required to be higher than the base impurity concentration to improve the emitter injection efficiency. However, as the base is thinned, a punch-through breakdown voltage is lowered. To obtain a high punch-through breakdown voltage, the base concentration is required to increase. As a result, the emitter/base junction becomes a high impurity concentration pn junction, in which a band-to-band tunnel current is tend to increase, which hinders a normal transistor operation. When the collector-emitter breakdown voltage is kept at about 3 volts in the silicon transistor, the lower limit of the base thickness is about 50 nm and the upper limit of the corresponding cut-off frequency is about 50 GHz considering the above-discussed situations.

To make the base layer thinner and to make the cut-off frequency higher over these limits, a hetero-emitter structure in which the forbidden band width of the emitter is larger than that of the base is attracting attention. In the hereto-emitter structure, since the injection of, for example, positive holes from the base of an npn transistor to its emitter is suppressed due to the difference of widths between the forbidden bands of the base and emitter, the injection efficiency is not lowered even if the emitter concentration is lowered below the base concentration. Therefore, the emitter and base concentrations can be determined independently from the injection efficiency, so that the base concentration can be increased enormously compared to the conventional homojunction transistors. As a result, the base thickness can be reduced and therefore the cut-off frequency can be made higher.

In order to realize such heterojunction bipolar transistor, it is required to coincide the position of the heterojunction with the position of the pn junction between the emitter and base with the accuracy in the order of 1 nm. Further, it is required to increase the base concentration in order to reduce the base thickness. However, it is very difficult for the existing technology to satisfy these two requirements at the same time. This is because, in the fabrication of bipolar transistors for example, diffusion techniques are employed to form the emitter and the base as well as to form the high concentration layer for the leading electrode. During high temperature treatment in the diffusion process, highly concentrated impurities doped into the base layer are likely to diffuse, which deviates the position of the pn junction from the position of the heterojunction.

In order to realize higher speed bipolar transistors, the base layer must be as thin as in the order of 10 nm. Therefore, it has been a problem to be solved how to form the high concentration layer to lead the base electrode.

As discussed above, the conventional HBT has a problem that highly concentrated impurities doped into the base layer are diffused in the high temperature treatment of the diffusion process when forming the high concentration layer for leading the base electrode, and therefore the position of the on junction deviates from the position of the heterojunction.

SUMMARY OF THE INVENTION

It is therefore an object of the present invention to provide a high-cut-off frequency, high speed HBT by lowering the heat treatment temperature performed after the formation of the high concentration base layer so as to suppress the diffusion of the impurities to a great extent.

According to the present invention, the base electrode which contacts the base layer and the emitter layer is made of metal or an intermetallic compound, and the height of Schottky barrier formed between the metal or intermetallic compound and the emitter layer is larger than the width of the forbidden band of the base layer.

In a method of fabricating a semiconductor device according to the present invention, there are provided the steps of successively laminated on a substrate a first conductive type semiconductor layer acting as a collector layer, a second conductive type semiconductor layer acting as a base layer and a first conductive type semiconductor layer acting as an emitter layer, forming a base region in which a base electrode is to be formed on the laminated semiconductor layers, a metal film is formed on an outer base area of the base region, an intermetallic region is formed by heat treatment so as to form an emitter electrode, a collector electrode is formed to contact the collector layer, and a base electrode is formed to contact the intermetallic compound.

In a semiconductor device according to the present invention, a base electrode is made of a metal or an intermetallic compound which forms a Schottky barrier with the emitter layer and ohmic contact with the base layer, and the barrier potential of the Schottky junction between the emitter layer and the metal or intermetallic compound is higher than the diffusion potential of the on junction. The base electrode extends through the emitter layer to reach the base layer.

Since the base electrode is made of metal or intermetallic compound as described above, the Schottky barrier formed between the emitter and the base electrode is larger than the voltage which turns on the emitter/base junction. Therefore, although the base electrode contacts both the emitter and base layers, it is possible to bias the on junction in forward direction sufficiently to thereby assure a normal transistor operation.

The theoretical view of the present invention will now be described with reference to an energy band diagrams of FIGS. 10 and 11.

FIG. 11 illustrates the energy bands of the emitter and base in a conventional homojunction transistor in which the energy barrier at zero bias is represented by $\phi_{pn}$, which is substantially equal to the width of the forbidden band of the semiconductor. In the junction between the emitter semiconductor and the metal, the Fermi level of the metal is pinned in the forbidden band of the semiconductor in Si, Ge, GaAs, InP and InGaAs which are important electronic materials. Consequently, as shown in FIG. 11(b), the energy barrier $\phi_{MS}$ between the emitter semiconductor and the metal is always lower than the junction potential $\phi_{pn}$ of the on junction ($\phi_{MS} < \phi_{pn}$).

Therefore, in the conventional homojunction transistor, it is impossible to employ a structure in which the base electrode metal is in contact with the emitter. This is because even if the emitter/base junction is biased in forward direction, the applied voltage is clamped by the Schottky barrier potential formed by the emitter semiconductor and base electrode metal.

However, situation differs in a heterojunction bipolar transistor in which the forbidden band of the emitter is larger than that of the base.

Referring to FIG. 10(a), in the heterojunction bipolar transistor, the energy barrier $\phi_{pn}$ between the emitter and base is substantially equal to the width Eg2 of the forbidden band of the base semiconductor under the thermally balanced state. The energy barrier $\phi_{MS}$ between the emitter semiconductor and the metal is smaller than the width Eg1 of the forbidden band of the emitter semiconductor (FIG. 10(b)). However, it is possible to establish the relation of Eg1 > $\phi_{MS}$ > Eg2 ≅ $\phi_{pn}$.

If such relationship is realized, the on junction can be biased in forward direction to thereby assure a normal transistor operation even if the base electrode contacts the emitter semiconductor.

With the relationship being satisfied, the metal layer can contact the base layer through the emitter layer. This makes possible to provide a very thin base layer. At the same time, it becomes possible to reduce the base resistance because the base potential is directly controlled by the low resistance metal.

According to the inventive method, the collector, base and emitter layers are successively laminated on the semiconductor substrate, a mask of an insulating film pattern is formed in the emitter electrode forming region on the emitter layer and a metal film is then formed on the mask. Then, in the region in which the metal film is exposed from the mask, heat treatment is performed to form an intermetallic compound at least throughout the entire thickness of the emitter layer between the metal film and the base layer. Thereafter, the insulating film pattern on the emitter region is removed to form the emitter electrode, and the base electrode is formed such as to contact the intermetallic compound.

Therefore, no ion implantation for separating the base from the emitter and no ion implantation and diffusion step for forming the base contact layer is required. Only a low temperature heat treatment is required for forming the contact for HBT. The misalignment between the heterojunction and pn junction can be avoided and the base layer can be made extremely thin. Thus, it is possible to provide an HBT of excellent performances. Further, it is possible to employ a relatively thick metal or intermetallic compound which extends from the emitter layer to the base layer as the base electrode.

Since transistors can be produced at a low temperature process, high integration of elements can be easily achieved.

Because of no high temperature heating process, the present invention is especially suited when the integration of bipolar transistors is carried out after the formation of other devices such as CMOSs.

BRIEF DESCRIPTION OF THE DRAWINGS

FIG. 1 (b) is a sectional view illustrating another embodiment of the present invention;

DETAILED DESCRIPTION OF THE EMBODIMENTS

An embodiment of the present invention will be described hereinafter in detail with reference to the drawings.

Figure 1A:
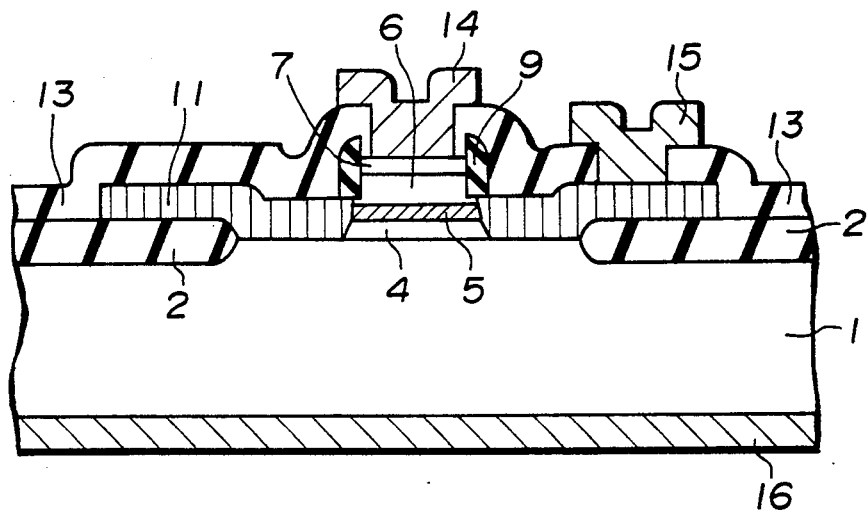
FIG. 1 (a) is a sectional view illustrating an embodiment of the present invention.

FIGS. 1(a) and (b) are cross-sectional views of a Si/Si$_{1-x}$Ge$_x$/Si npn type HBT.

The HBT is characterized in that the base electrode made of metal or an intermetallic compound is formed extending through the emitter layer into at least a part of the base layer formed so as to contact the base layer, that the metal or intermetallic compound forms Schottky barrier with the emitter layer having a wide forbidden band and makes an ohmic contact with the base layer having a narrow forbidden band, and that the barrier potential of the Schottky junction between the intermetallic compound or metal and emitter layer is higher than the diffusion potential of the on junction between the base having a narrow forbidden band and the emitter layer having a wide forbidden band.

An n-type Si substrate 1 with a specific resistivity of 0.1 Ω·cm is divided into a plurality of element regions by an element separation insulating film 2 formed by selective oxidation using LOCOS process. In each element region, a collector layer 4 made of n-type Si with an impurity concentration of $1 \times 10^{17}$ cm$^{-3}$ and having a thickness of 50 nm, a base layer 5 made of p$^+$-type Si$_{0.5}$Ge$_{0.5}$ with an impurity concentration of $1 \times 10^{20}$ cm$^{-3}$ and having a thickness of 10 nm, an emitter layer 6 made of n-type Si with an impurity concentration of $1 \times 10^{18}$ cm$^{-3}$ and having a thickness of 100 nm, and an emitter cap layer 7 made of an n$^+$-type Si$_x$Ge$_{1-x}$ graded composition layer (x:1−0.5) with an impurity concentration of $1 \times 10^{21}$ cm$^{-3}$ and having a thickness of 50 nm are epitaxially grown and laminated successively. A base contact layer 11 made of an intermetallic compound containing a main component of PtSi is formed such as to contact the base layer 5, an emitter electrode 14 is formed such as to contact the emitter cap layer 7, a base electrode 15 is formed such as to contact the base contact layer 11 and a collector electrode 16 is formed such as to contact the back of the silicon substrate 1 which acts as a collector contact. Reference numeral 13 denotes a silicon oxide film.

The process of manufacturing the HBT will now be described.

Figure 2:
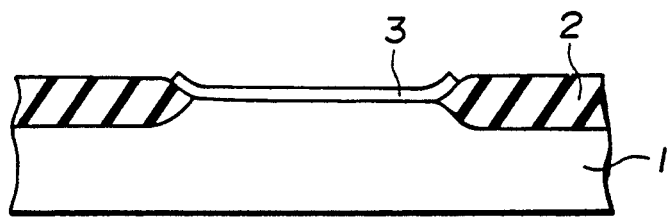
FIGS. 2-9 illustrate steps of fabricating the HBT.

Referring to FIG. 2, a surface of the n-type Si substrate 1 with specific resistivity of 0.1Ω·cm is selectively oxidized by LOCOS process by using a silicon nitride film 3 as a mask so as to form an element separation insulating film 2. Thus, the surface of the substrate is into plural element regions by the element separation insulating film 2.

Figure 3:
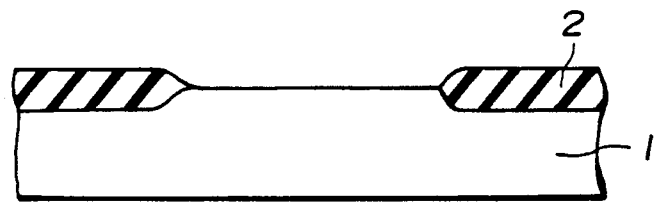

Then, as shown in FIG. 3, the silicon nitride film 3 used for selective oxidation is removed away to expose the surface portions of the silicon substrate. The resulting surface of the substrate is heated at 850° C. in a high vacuum atmosphere to decompose and remove away the native oxide film and so forth to purify the substrate surface.

Figure 4:
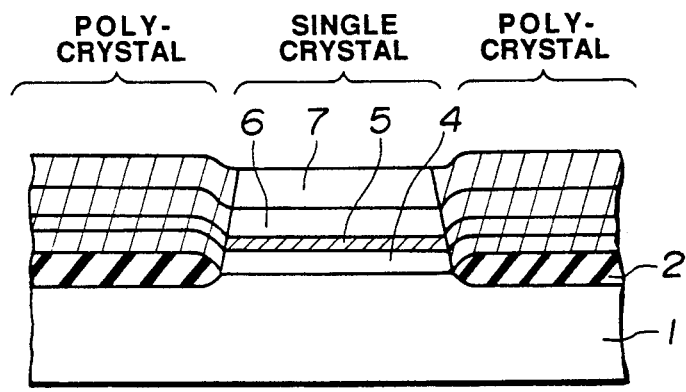

Further, as shown in FIG. 4, sequentially deposited on the substrate 1 by molecular-beam epitaxy are a collector layer 4 made of n-type Si with an impurity concentration of $1 \times 10^{17}$ cm$^{-3}$ and having a thickness of 50 nm, a base layer 5 made of p+-type $Si_{0.5}Ge_{0.5}$ with an impurity concentration of $1 \times 10^{20}$ cm$^{-3}$ and having a thickness of 10 nm, an emitter layer 6 made of n-type Si with an impurity concentration of $1 \times 10^{18}$ cm$^{-3}$ and having a thickness of 100 nm, and an emitter cap layer 7 made of an n+-type $Si_xGe_{1-x}$ graded composition layer (x:1−0.5) with an impurity concentration of $1 \times 10^{21}$ cm$^{-3}$ and having a thickness of 50 nm. Each of these layers is of polycrystal on the element separation insulating film 2 and of single crystal on the element region. The growth temperature was 600° C. The n+-type $Si_xGe_{1-x}$ graded composition layer 7 (x:1−0.5) is so constructed that x=1 at the interface with the emitter layer 6 made of an n-type Si layer, and x=0.5 on the surface thereof. With this construction, the height of the barrier with the emitter electrode metal on the surface of the layer 7 can be lowered and therefore the contact resistance with the emitter electrode can be reduced compared to the case of a pure silicon single crystal containing no Ge.

Figure 5:
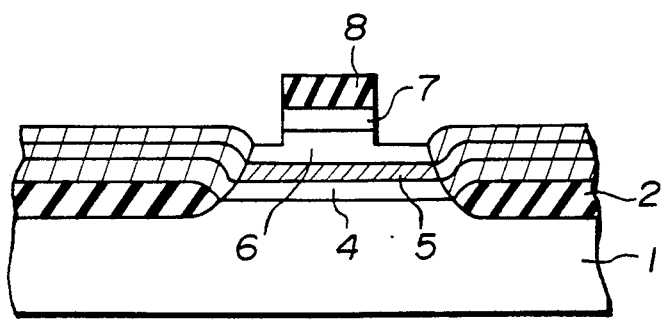

Referring to FIG. 5, a silicon nitride film 8 is formed and patterned by ordinary photolithography and part of n-type SiGe layer 7 and n-type silicon layer 6 is etched away by RIE with the silicon nitride film 8 as a mask. The etching depth should be controlled within a range of 100 nm ±20 nm. This controlled range is sufficiently achieved by the current technical level.

Figure 6:
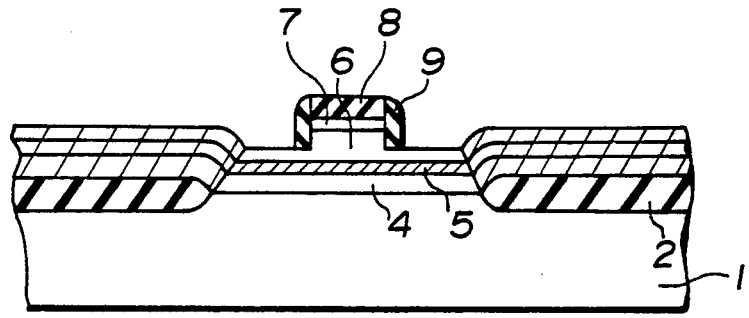

Referring to FIG. 6, a silicon oxide film 9 is deposited by CVD on the overall surface, and then is etched by RIE. Thus, a side-wall insulating film 9 of silicon oxide is formed on the side wall of a protrusion formed by the etching.

Figure 7:
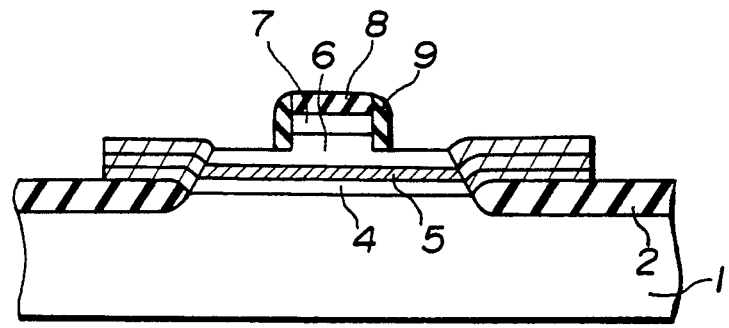

Then, a mask pattern (not shown) is formed, and as shown in FIG. 7, polycrystalline silicon film 4, polycrystalline SiGe film 5 and polycrystalline silicon film 6 on device separating and insulating film 2 are etched away except for a section which will later be the base electrode.

Figure 8:
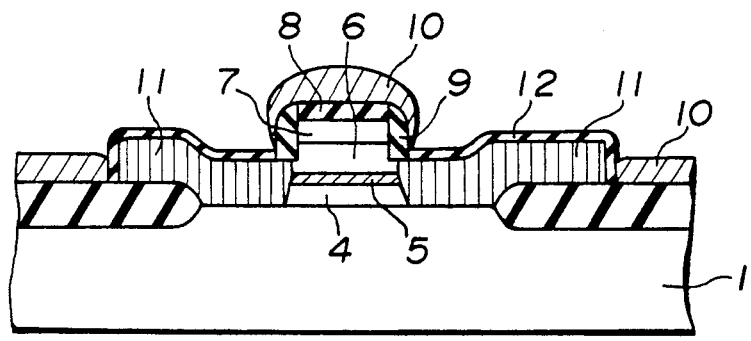

Referring to FIG. 8, a platinum layer 10 having a thickness of 200 nm is deposited by vacuum evaporation and then heat treated for 3 hours at 500° C. under nitrogen gas atmosphere containing 0.1% of oxygen.

As a result, the platinum reacts with silicon and SiGe to become an intermetallic compound 11 containing PtSi as main component. At this time, the PtSi layer is about 200 nm thick and extends through grown the films 4, 5, 6 to the substrate 1. Since the thickness of the intermetallic compound is determined depending on the thickness of the deposited metallic layer, the thickness of the deposited metal is required to be determined appropriately according to the desired thickness of the intermetallic compound. The upper surface of the intermetallic compound 11 is oxidized by the oxygen contained in the nitrogen gas atmosphere the temperature of which increases, to thereby form a silicon oxide film 12 of about 10 nm thick.

On silicon oxide films 2, 9 and silicon nitride film 8, platinum remains unreacted.

Figure 9:
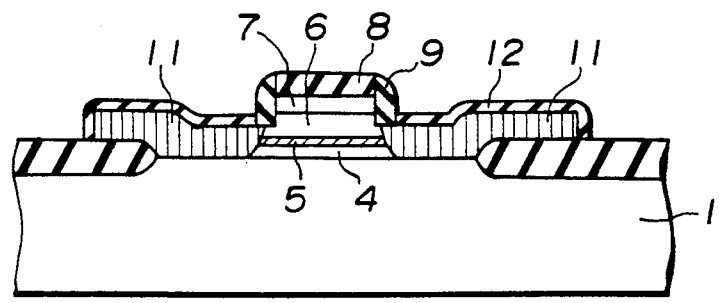
Figure 10:
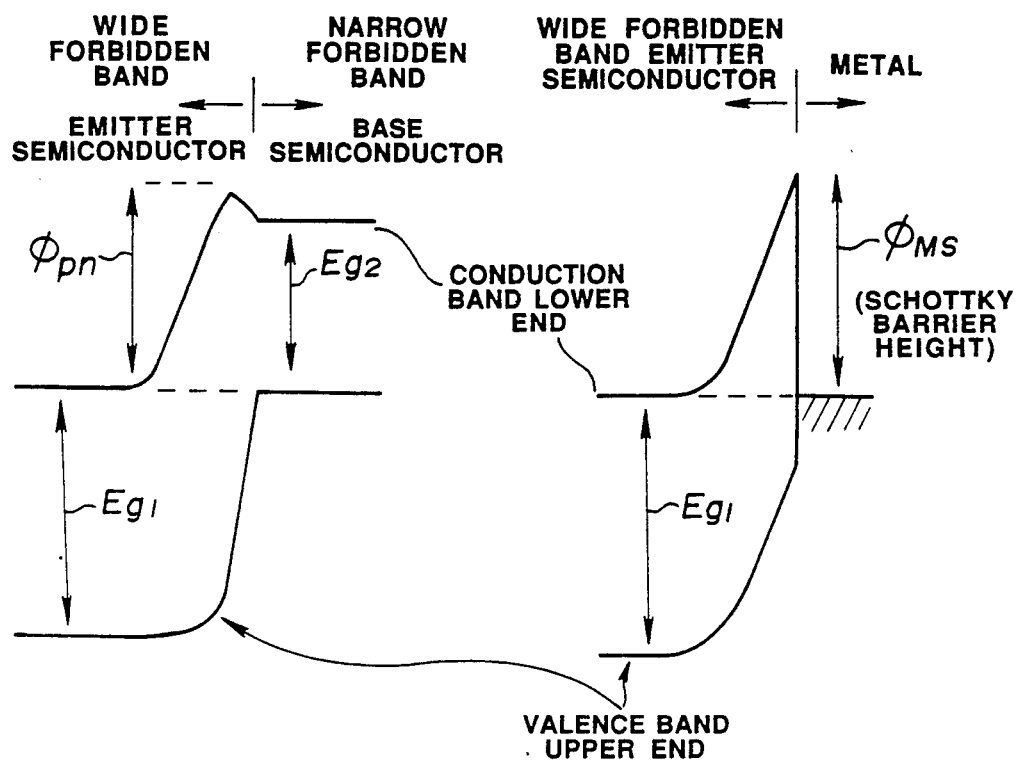
FIG. 10(a) and 10(b) illustrates the energy band of the HBT according to the present invention.
Figure 11:
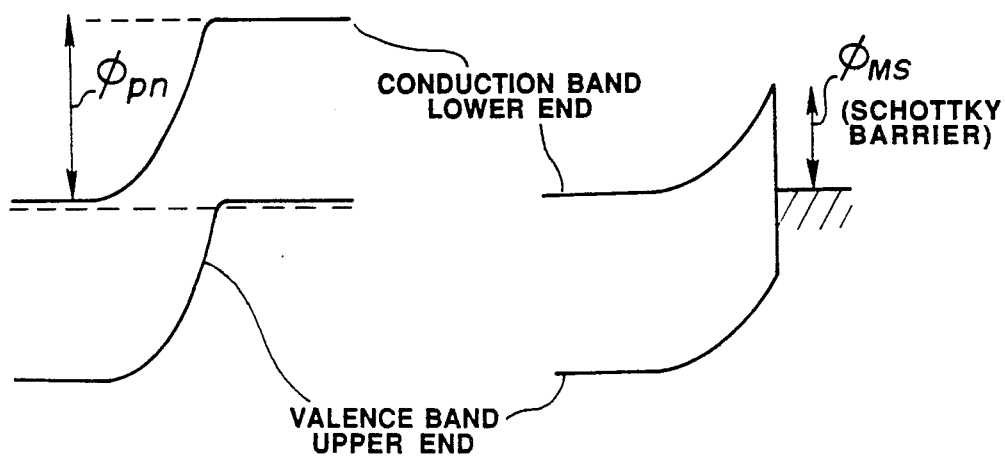
FIG. 11(a) and 11(b) illustrates the energy band of a conventional homotransistor.

As shown in FIG. 9, the unreacted platinum 10 is etched away with aqua regia. At this time, the PtSi layer 11 is protected from aqua regia by the silicon oxide layer 12 on the surface.

Figure 1B:
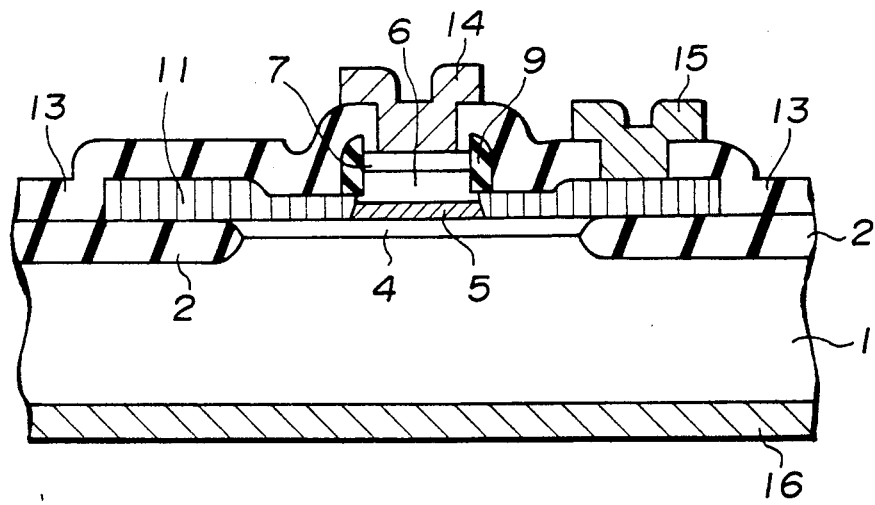

The silicon nitride film 8 is etched with a phosphoric acid, and then, referring to FIG. 1, a silicon oxide film 13 of 500 nm thick is deposited by CVD. A window for the emitter is formed in the silicon oxide film 13, a via hole is formed in the oxide PtSi layer 11 as the base contact, and an emitter electrode 14 and a base electrode 15 of a TiN/Al layer are formed after the formation of an opening in the silicon oxide film 13. Further, a collector electrode 16 is formed on the back of silicon substrate 1 to thereby complete the HBT shown in FIG. 1 (a).

In the embodiment of FIG. 1(a), the junction of the polycrystal region on the silicon oxide film 2 is connected in parallel with the base/collector junction thereby increasing the leak current in the base/collector junction. To prevent the increase in the leak current, this embodiment is so constructed that the PtSi layer 11 extends through the base layer 5 to contact the collector region 4 and 1.

Figure 12:
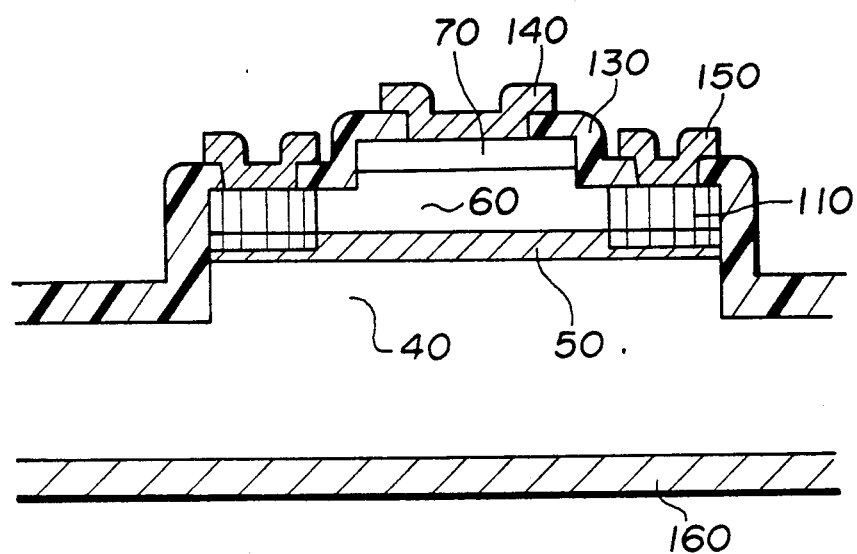
FIG. 12 a sectional vies illustrating still another embodiment of the present invention.

However, when the device is to be applied to the case where the leak current causes no serious problems, it may be so constructed that the PtSi layer 11 does not extend through the base layer 5. Further, as shown in FIG. 12, when the base/collector junction is separated by mesa etching, the leak current increase is prevented even though the PtSi layer 110 does not extend through the base layer 50. In FIG. 12, the reference numeral 40 represents a n-type Si collector, 50 p+-type $Si_{0.5}Ge_{0.5}$ base layer, 60 n-type Si emitter, 70 n+-type SiGe emitter contact layer, 130 SiO2 film, 140 emitter electrode, 150 base electrode and 160 collector electrode.

The HBT thus formed does not require any of an activating process in ion implantation, and a high temperature processing step in a temperature range of 800–1000° C. required for selective diffusion, as required in the conventional process. In the epitaxial growing process and subsequent processes, electrodes are formed without increasing the growth temperature beyond 600° C. to thereby provide a structure where the heterojunction and on junction obtained by epitaxial growth coincide.

The Schottky barrier between PtSi and Si is 0.85 eV, and is larger than 0.6 eV of the width of the forbidden band of $Si_{0.5}Ge_{0.5}$ lattice-matched with the silicon substrate. Thus, the emitter/base junction can be biased in the forward direction so as to perform a normal transistor operation. Stress due to the difference between the lattice constants are involved between the $Si_{0.5}Ge_{0.5}$ layer and Si, but an epitaxial growth layer can be formed on the silicon substrate without generation of dislocation by suppressing the thickness of the $Si_{0.5}Ge_{0.5}$ layer to 10 nm.

In the embodiment of the present invention, a contact is easily formed by sinking PtSi layer 11 having a thickness of 200 nm from the surface of the semi-finished device to the thin base layer. The height of the Schottky barrier of the PtSi layer to the p-type $Si_{0.5}Ge_{0.5}$ layer is very small, for example, 0.1 eV to thereby provide a satisfactory ohmic contact.

In the HBT thus obtained, the base layer is thin, for example, 10 nm, so that the electron transmit time in the device is short and the cut-off frequency is 100 GHz or more.

According to the present invention, since a transistor can be formed without subjecting to high temperature process, integration of the transistors together with other elements is achieved without inviting a deterioration in the device characteristic.

While in the above embodiment PtSi is illustrated as being used as the intermetallic compound, substances with high Schottky barrier against n-Si such as IrSi may be used. As just described above, in the present invention, a semiconductor layer and a metal which forms a metallic compound are required to be selected appropriately for the purpose of use. In the GaSb/GaAs materials, a metal which cooperates with those materials to form an intermetallic compound may be used.

While in the above embodiment the npn type HBT of Si/SiGe/Si has been described, the present invention is not limited to it. For example, npn-type HBTs of a GaSb/GaAs or pnp-type HBTs using these materials produce effects similar to those produced by the HBTs of the embodiment. The concentration of impurities in and thickness of the respective semiconductor layers may be changed appropriately as required.

In addition, the semiconductor layer may be etched up to the base layer, and a metal which becomes an ohmic contact with the base layer and which forms a Schottky junction which provides a barrier potential larger than the pn junction for the emitter layer may be used in place of the intermetallic compound.

In addition, the present invention may be carried out in various modifications in the scope of the present invention without departing from its spirit.

As described above, according to the present invention, the base electrode is formed without using ion implantation and diffusion processes using the high temperature treatment. Accordingly, a very thin base layer and hence a transistor operable at high speed can be produced.

What is claimed is:

1. A semiconductor device comprising:
   a collector layer made of a first conductive type semiconductor;
   a base layer made of a second conductive type semiconductor; and
   an emitter layer made of the first conductive type semiconductor, said collector layer, base layer and emitter layer being laminated successively on a substrate,
   wherein a base electrode is made of a metal or an intermetallic compound and contacted with the base layer and emitter layer,
   wherein said emitter layer having a first forbidden band gap energy $E_{g1}$, said base layer having a second forbidden band gap energy $E_{g2}$, and a junction formed between said base electrode and said emitter layer having a Schottky barrier height $\phi_{MS}$; $E_{g1}$, $E_{g2}$ and $\phi_{MS}$ satisfyinq the following equation:

$$E_{g1} > \phi_{MS} > E_{g2}.$$

2. A semiconductor device according to claim 1, wherein the intermetallic compound is platinum silicide (PtSi).

3. A semiconductor device according to claim 1, wherein the intermetallic compound is iridium silicide (IrSi).

4. A semiconductor device according to claim 1, wherein the collector layer comprises an n-type Si layer, the base layer comprises a p$^+$-type SiGe layer, the emitter layer comprises an n-type Si layer, and the base electrode comprises a platinum silicide (PtSi) layer.

5. A semiconductor device according to claim 1, wherein the collector layer comprises an n-type Si layer, the base layer comprises a p$^+$-type SiGe layer, the emitter layer comprises an n-type Si layer, and the base electrode comprises an iridium silicide (IrSi) layer.

6. A semiconductor device according to claim 4 or 5, further comprising an emitter cap layer made of an n$^+$-type Si$_x$-Ge$_{1-x}$ graded composition layer formed on the emitter layer, wherein x is within a range of 0.5 to 1.0.

7. A semiconductor device according to claim 1, wherein the collector layer comprises an n-type GaAs layer, the base layer comprises a p$^+$-type GaSb layer, the emitter layer comprises an n-type GaAs layer and the base electrode is made of an alloy of platinum (Pt), gallium (Ga), arsenic (As) and antimony (Sb).

8. A semiconductor device comprising:
   a collector layer made of a first conductive type semiconductor;
   a base layer made of a second conductive type semiconductor;
   an emitter layer made of the first conductive type semiconductor, said collector layer, base layer and emitter layer being laminated successively on a substrate;
   a base electrode constituted of a metal layer or an intermetallic compound layer, said base electrode extending through said emitter layer and said base layer from a part of a surface of said emitter layer to said collector layer; and
   an emitter electrode disposed at another part of the surface of said emitter layer,
   wherein said emitter layer having a first forbidden band gap energy Eg1, said base layer having a second forbidden band gap energy Eg2, and a junction formed between said base electrode and said emitter layer having a Schottky barrier height $\phi$MS; Eg1, Eg2 and $\phi$MS satisfying the following equation:

$$Eg1 > \phi MS > Eg2.$$

9. A semiconductor device comprising:
   a collector layer made of a first conductive type semiconductor;
   a base layer made of a second conductive type semiconductor; and
   an emitter layer made of the first conductive type semiconductor, said collector layer, base layer and emitter layer being laminated successively on a substrate,
   a base electrode being in contact with the base layer and the emitter layer,
   wherein said emitter layer having a first forbidden band gap energy Eg1, said base layer having a second forbidden band gap energy Eg2, and a junction formed between said base electrode and said emitter layer having a Schottky barrier height $\phi$MS; Eg1, Eg2 and $\phi$MS satisfying the following equation:

$$Eg1 > \phi MS > Eg2.$$

* * * * *